United States Patent [19]

Smayling

[11] Patent Number: 5,500,548
[45] Date of Patent: Mar. 19, 1996

[54] NON-EPITAXIAL CMOS STRUCTURES AND PROCESSORS

[75] Inventor: Michael C. Smayling, Missouri City, Tex.

[73] Assignee: Texas Instruments Incorporated, Dallas, Tex.

[21] Appl. No.: 368,939

[22] Filed: Jan. 5, 1995

[51] Int. Cl.$^6$ .................................................. H01L 29/76
[52] U.S. Cl. .................. 257/371; 257/372; 257/373; 257/376; 257/394; 257/773
[58] Field of Search ................................ 257/371, 372, 257/373, 376, 394, 773

[56] References Cited

U.S. PATENT DOCUMENTS 5,003,362  3/1991  Lee et al. ................................ 257/394

Primary Examiner—Edward Wojciechowicz
Attorney, Agent, or Firm—Robert D. Marshall, Jr.; James C. Kesterson; Richard L. Donaldson

[57] ABSTRACT

An integrated circuit device (10) is provided that comprises an P-FET (12) and an N-FET (14) formed on a semiconductor substrate (32). The P-FET (12) is formed in an n–tank (46). The source (18) and back-gate contact (22) of the P-FET (12) are connected to the $V_{DD}$ supply voltage. A current sink region (50) is formed in contact with the bulk semiconductor substrate (32). Periodic back-gate contacts (30) and (52) are made to the current sink region (50). The source (26) of N-FET (14) is also connected to the back-gate contacts (30) and (52). The current sink region (50) provides a low resistance path for charge within the substrate (32) to paths to the supply voltage $V_{SS}$. This low resistance path prevents voltage from building up in the substrate (32) and thereby prevents latchup from occurring.

8 Claims, 2 Drawing Sheets

5,500,548

NON-EPITAXIAL CMOS STRUCTURES AND PROCESSORS

TECHNICAL FIELD OF THE INVENTION

This invention relates in general to the field of electronic devices and more particularly to improved non-epitaxial CMOS processes and structures to prevent latchup.

BACKGROUND OF THE INVENTION

Typical complementary metal oxide semiconductor (CMOS) logic devices place n-channel and p-channel transistors in close proximity to one another. Together with the semiconductor material forming the substrate of the integrated CMOS device, the diffused regions within the logic device can form parasitic transistors. If these parasitic transistors are biased appropriately, the transistors can effectively short the supply voltage to ground potential in a condition that is referred to as "latchup". Latchup can result in, at best, disruption of the logic processes conducted by the device and, at worst, destruction of the device. Latchup may be prevented by holding the voltage of the substrate close to the voltage level of one of the supply voltage levels which may comprise, for example, ground potential. This may be accomplished by providing low resistance current paths to ground potential electronically coupled to the semiconductor substrate material. One method used to accomplish this in prior systems is the use of a low resistance substrate having an epitaxial layer of semiconductor material formed outwardly from the low resistance layer. The use of epitaxial substrates is highly effective in preventing latchup but is a very expensive solution and is becoming more and more expensive as semiconductor wafer diameters increase. An alternate solution is the use of low resistance guard rings surrounding the n-channel devices within the integrated CMOS structure constructed on a p-type semiconductor substrate. This solution is commonly used in input/output devices where the output pins of the integrated devices are susceptible to dramatic fluctuations due to external systems. The use of guard rings is effective but is, once again, very expensive in terms of the amount of surface area that must be dedicated to the guard rings.

SUMMARY OF THE INVENTION

Accordingly, a need has arisen for a non-epitaxial CMOS process and structure which prevents latchup of the integrated CMOS device but which does not require expensive epitaxial layers or the dedication of semiconductor surface area to guard ring structures.

In accordance with the teachings of the present invention, a CMOS structure is provided that substantially eliminates or reduces problems associated with prior solutions. According to one embodiment of the present invention, an integrated semiconductor device comprises active regions separated by routing channels. The routing channels include conductive interconnects coupled to active circuitry within the active areas. The conductive interconnects are separated from a semiconductor substrate by a field oxide layer. The semiconductor substrate includes conductive regions formed therein and coupled to a supply voltage. The conductive regions are operable to pass current from the substrate to maintain the voltage of the substrate close to the voltage of one supply voltage.

BRIEF DESCRIPTION OF THE DRAWINGS

A more complete understanding of the teachings and advantages of the present invention may be acquired by referring to the accompanying FIGUREs in which like reference numbers indicate like features and wherein.

DETAILED DESCRIPTION OF THE INVENTION

Figure 1:
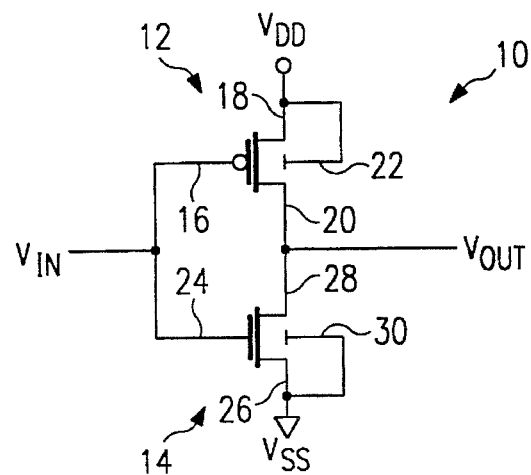
FIG. 1 is a schematic illustration of a CMOS inverter circuit constructed according to the teachings of the present invention.

FIG. 1 illustrates a CMOS inverter circuit indicated generally at 10 which comprises a p-channel field effect transistor (P-FET) indicated generally at 12 and an n-channel field effect transistor (N-FET) indicated generally at 14. P-FET 12 comprises a gate 16 which is coupled to an input voltage $V_{IN}$. P-FET 12 also comprises a source 18 which is coupled to a high supply voltage $V_{DD}$. The $V_{DD}$ supply voltage may comprise, for example, five volts. P-FET 12 also comprises a drain 20 which is coupled to an output voltage $V_{OUT}$. P-FET 12 also comprises a back-gate contact 22 which is also coupled to $V_{DD}$. As will be discussed with reference to FIG. 2, P-FET 12 is typically formed in an n-type well formed in a p-type semiconductor substrate. As such, back-gate contact 22 comprises a surface contact to the n-type well region.

N-FET 14 comprises a gate 24 which is coupled to $V_{IN}$ and to gate 16 of P-FET 12. N-FET 14 also comprises a source 26 which is coupled to a low supply voltage $V_{SS}$. Typically, $V_{SS}$ will be coupled to ground potential while $V_{DD}$ will be coupled to a supply voltage on the order of 5 volts. N-FET 14 also comprises a drain 28 which is coupled to the output voltage node $V_{OUT}$ and to drain 20 of P-FET 12. N-FET 14 also comprises a back-gate contact 30 which is coupled to the $V_{SS}$ supply voltage. The resistance of the contact path between back-gate contact 30 and the $V_{SS}$ supply voltage is critical to preventing latchup. In prior art systems, back-gate contact 30 would actually be a contact to the back of a semiconductor die and would be contacting the highly-doped substrate beneath the epitaxial layer containing the active circuitry. According to the teachings of the present invention, however, back-gate contact 30 is a surface contact which is formed to highly-doped p+ regions formed in selected areas of the semiconductor surface as will be discussed herein. As discussed previously, latchup can occur when the voltage of the p-type substrate raises with respect to the voltage level of the supply voltage $V_{SS}$. If this is allowed to occur, parasitic transistors can become active and a low resistance path can result between $V_{DD}$ and $V_{SS}$. By keeping the voltage level of the substrate close to the voltage level of the supply voltage $V_{SS}$, the parasitic transistors are not allowed to become active.

Figure 2:
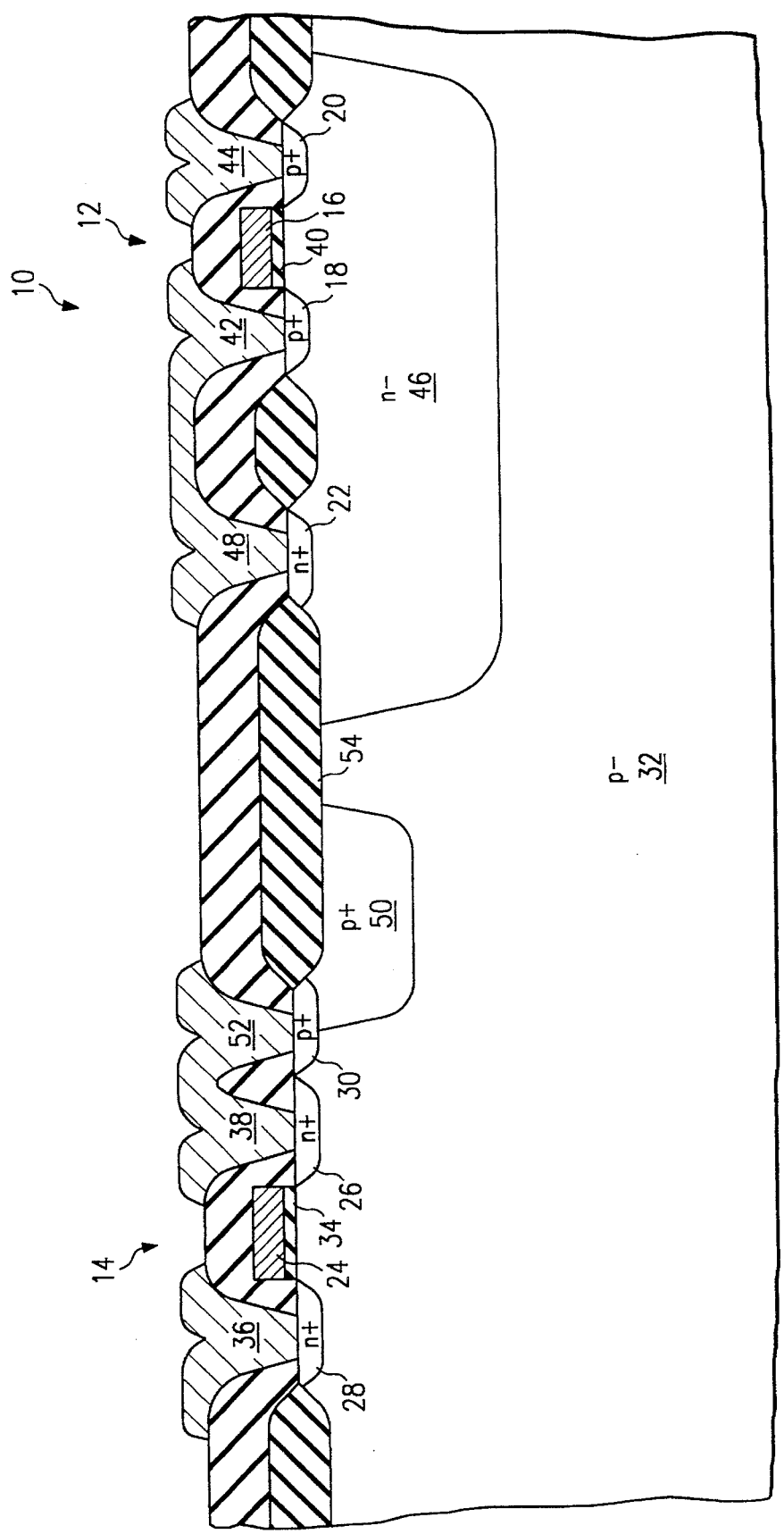
FIG. 2 is a cross-sectional elevational diagram of a CMOS device constructed according to the teachings of the present invention.

FIG. 2 is a cross-sectional elevational diagram illustrating one embodiment of CMOS inverter circuit 10 discussed with reference to FIG. 1 previously. Circuit 10 is formed on a p– substrate 32. N-FET 14 is formed on one portion of substrate 32 while P-FET 16 is formed on another portion of substrate 32. Gate 24 of N-FET 14 is separated from the outer surface of substrate 32 by gate oxide layer 34. The channel of N-FET 14 is formed between drain region 28 and source region 26 formed in the outer surface of substrate 32. Both regions 36 and 38 comprise regions which are heavily doped with n-type impurities. A drain interconnect 36 is electrically coupled to drain 28 and a source interconnect 38 is electrically coupled to source 26.

Gate 16 of P-FET 12 is insulated from the outer surface of substrate 32 by a gate oxide layer 40. The channel of P-FET 12 is disposed between the p+ source 18 and a p+ drain 20. P-FET 12 is formed in an n− tank 46 which is formed proximate the surface of p− substrate 32. P+ source 18 is coupled to a source interconnect 42. P+ drain 20 is coupled to a drain interconnect 44. Back-gate contact 22 is electrically connected to n− tank 46 and is electrically connected to a back-gate interconnect 48. As discussed with reference to FIG. 1, back-gate contact 22 and source 18 are electrically connected together. As shown in FIG. 2, various isolation layers are used to separate the electrically conductive portions of device 10. These isolation layers may comprise, for example, layers of silicon dioxide.

The cross-sectional view of device 10 in FIG. 2 makes it readily apparent where parasitic transistors might form if voltage levels are not controlled properly. For example, a parasitic pnp bipolar transistor may form between p+ region 18, n− tank 46 and p− substrate 32. Further, an npn bipolar parasitic transistor may form between n+ region 26, p− substrate 32 and n− tank 46. These parasitic transistors may become activated and conduct large amounts of current if the voltage of p− substrate 32 is allowed to rise relative to supply voltage level $V_{SS}$. According to the teachings of the present invention, the voltage of substrate 32 is controlled by creating a current sink region 50 which provides for a low resistance current path between substrate 32 and back-gate contact 30.

As shown in FIG. 2, contact is made between back-gate contact 30 and current sink region 50. Current sink region 50 may comprise, for example, a diffused region containing a large concentration of p-type impurities such as boron 11 ($B^{11}$). Current sink region 50 is shown formed beneath a field oxide layer 54.

As will be discussed more completely with reference to FIG. 3, current sink region 50 may be placed in an integrated semiconductor device inwardly from areas of field oxide such as field oxide layer 54 to provide for low resistance paths of current from substrate 32. Field oxide layer 54 is intended to represent significant portions of substrate 32 which do not contain active semiconductor devices and as such are largely unused in current semiconductor architectures. These areas are used as sites for the formation of current sink regions to provide for low resistance current paths to prevent the buildup of voltage in the substrate 32 without the necessity of dedicating portions of active regions to surface contacts to substrate 32 or requiring the formation of low resistance sub-epitaxial substrates.

Current sink region 50 shown in FIG. 2 may be formed by implanting boron 11 ($B^{11}$) at a dose on the order of $10^{14}$ ions per square centimeter. This implantation step is performed after the implantation of the n-type ions used to form n− tank 46. Both n− tank 46 and current sink region 50 may then be subjected to a tank drive process which comprises heating the device to on the order of 1100° C. for on the order of 500 minutes. This process will drive both the p-type ions in current sink region 50 and the n-type ions in n− tank 46 to a depth on the order of 2 to 3 microns. This process will provide for a large amount of surface area interfacing current sink region 50 and substrate 32. Further, the process will provide for a resistance of the current sink regions 50 on the order of 500 to 800 ohms per square.

Alternatively, the current sink region may be formed after the formation of n− tank 46 has been completed. Under this process, the p-type ions which may comprise, for example, boron 11 ($B^{11}$), are implanted using a high energy implantation process of 150 KeV with a dose on the order of $10^{15}$ ions per cubic centimeter. The implanted ions are then subjected to a drive step of heating the device to on the order of 900° C. for 500 minutes. This process will create a higher concentration of ions within current sink region 50 with a shallower depth of penetration of current sink region 50. Current sink region 50 will be on the order of 1 to 2 microns in depth and will have a resistance on the order of 150 to 200 ohms per square. As such, under the first method, a larger interface surface area is provided with a larger resistance. Under the second method, a shallower region is formed having a smaller interface surface area but with a lower resistance. Either method provides for an extremely low resistance path for charge built up in substrate 32 to be conducted to the source voltage level $V_{SS}$ and prevents latchup from occurring.

Figure 3:
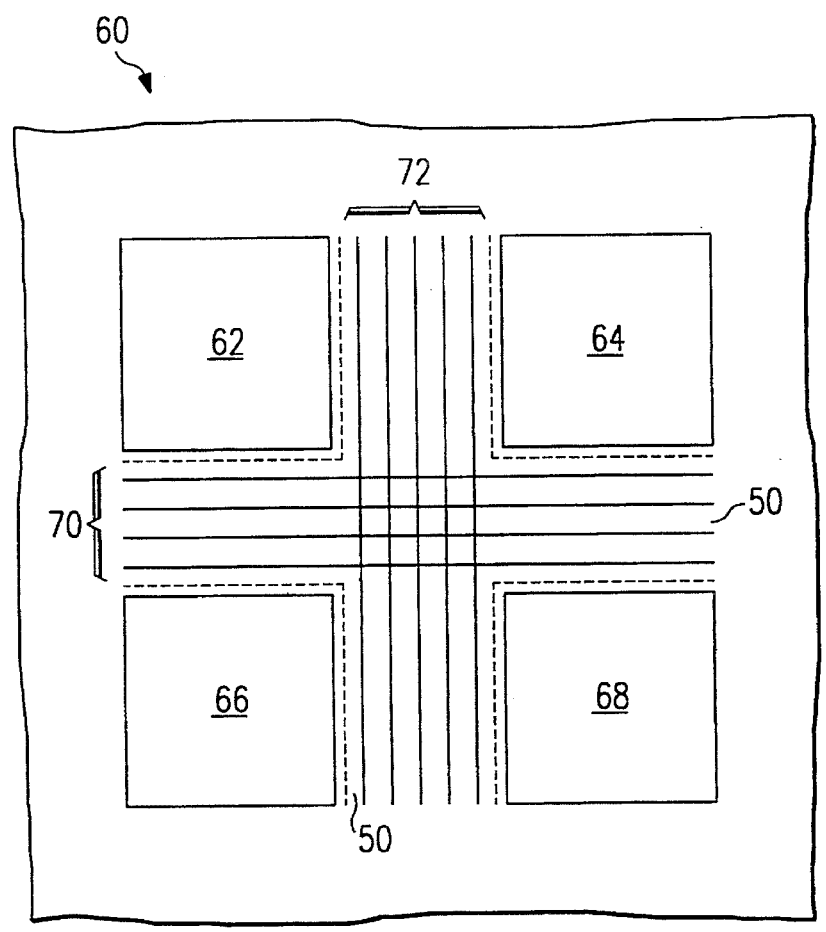
FIG. 3 is a schematic diagram illustrating the layout of an integrated CMOS device constructed according to the teachings of the present invention.

FIG. 3 illustrates a portion of an integrated semiconductor device indicated generally at 60 which comprises four active regions 62, 64, 66, and 68. Regions 62, 64, 66 and 68 are separated by routing channels 70 and 72. In modern compiler-based layout systems, active circuitry is commonly grouped into active regions such as active regions 62, 64, 66 and 68 on the surface of a semiconductor substrate. The grouping of active circuitry creates the routing channels 70 and 72 to allow for the routing of interconnect signals, supply signals and the like which are grouped together to form buses of metal and other conductive interconnect pathways. The routing channels 70 and 72 ordinarily do not contain active circuitry but are usually parallel strips of conductive material conducting the signals described previously.

According to the teachings of the present invention, the routing channels such as routing channel 70 and 72 shown in FIG. 3 are ideal places within an integrated device to form current sink regions such as current sink region 50 described with reference to FIG. 2. The entire surface area occupied by routing channels such as routing channel 70 and 72 may comprise on the order of ten to twenty percent of the surface area of an integrated semiconductor device. As such, a great deal of interface surface area can be created between the current sink region 50 and the semiconductor substrate 32 used to create a device. Further, the placement of the current sink region 50 within a routing channel allows for many opportunities to connect the current sink region 50 and the lower voltage supply $V_{SS}$ as one of the signals routed in the buses disposed within the routing channel 70 and 72 will be the signal associated with the $V_{SS}$ supply voltage. Accordingly, periodic interconnects can be made between the conductive path of the $V_{SS}$ signal and the surface of the semiconductor substrate in which the current sink region is formed. As shown by dashed lines in FIG. 3, the current sink regions 50 may underlie the entire routing channels 70 and 72 and be placed very near the edges of the active regions 62, 64, 66 and 68. A further advantage of this architecture is the fact that the placement of current sink regions 50 can be extracted from the completed layout in an automated fashion by placing the current sink regions 50 everywhere that an active region does not reside. In this manner, the current sink regions 50 do not have to be individually created during the layout process but can be extracted from other structures which already exist.

An important technical advantage of the present invention inheres in the fact that the creation of the current sink regions 50 allows for an extremely low resistance path to be formed throughout the integrated device 60. It can be seen in FIG. 3 that any place within one of the active regions 62, 64, 66 and 68 is within one square of a portion of the interconnect region 50. As such, the resistance between any point within the active regions 62, 64, 66 or 68 to the $V_{SS}$ supply voltage will be something less than the 100 to 500 ohms per square associated with the methods of creating current sink region 50 described previously. As such, the substrate 32 on which the integrated circuit 60 is formed can be kept at a voltage level very close to the $V_{SS}$ supply level and thereby prevent any danger of latchup of occurring. Using the techniques of the present invention, the substrate can be kept closer than one p-n diode forward voltage of approximately 0.6 to 0.7 volts with respect to $V_{SS}$ in order to prevent latchup from occurring.

Although the present invention has been described in detail, it should be understood that various changes, substitutions, alterations and modifications may be made to the teachings described herein without departing from the scope of the present invention which is defined solely by the appended claims.

What is claimed is:

1. An integrated circuit device formed on a semiconductor substrate having a first conductivity type, the device comprising:

a first field effect transistor having a channel of the first conductivity type, a gate coupled to an input voltage, a source coupled to a first supply voltage, a drain coupled to $V_{OUT}$ and a backgate contact coupled to the first supply voltage;

a second field effect transistor having a channel of second conductivity type, a gate coupled to an input voltage, a source coupled to a second supply voltage, a drain coupled to $V_{OUT}$ and a backgate contact coupled to the second supply voltage;

the first field effect transistor formed in a region of the substrate doped with impurities of the second conductivity type;

a current sink region formed in the substrate doped with impurities of the first conductivity type and coupled to the second supply voltage such that latchup of the device is prevented by conducting charges from the substrate to the second supply voltage to keep the voltage level of the substrate near the voltage level of the second supply voltage.

2. The device of claim 1, wherein the first conductivity type comprises p-type, the second conductivity type comprises n-type and the second supply voltage level comprises ground potential.

3. The device of claim 1 wherein the voltage level of the substrate is kept within approximately 0.7 volts of the second supply voltage.

4. An integrated circuit device formed on a p-type semiconductor substrate comprising a p-channel field effect transistor comprising a source coupled to a first supply voltage, a gate coupled to an input voltage, a drain coupled to an output node, and a back-gate contact coupled to the first supply voltage;

an n-channel field effect transistor having a source coupled to a second supply voltage, a gate coupled to the input voltage signal, a drain coupled to the output node;

the p-channel field effect transistor formed in an n-type well formed on the surface of the substrate; and a p-type current sink region formed in the semiconductor substrate and operable to conduct electricity from the semiconductor substrate to the second supply voltage such that the voltage level of the semiconductor substrate is maintained at a level near the voltage level of the second voltage supply.

5. The device of claim 4 wherein the voltage level of the substrate is kept within approximately 0.7 volts of the second supply voltage.

6. An integrated device formed on a semiconductor substrate comprising active regions defined on the surface of the semiconductor substrate containing active semiconductor devices including p-channel and n-channel transistors;

routing channels disposed between the active regions and separating the active regions one from the other, the routing channels comprising conductive pathways operable to route signals to the active semiconductor devices within the active regions;

a field isolation layer separating the conductive pathways from the semiconductor substrate within the routing channels;

current sink regions formed proximate the surface of the semiconductor substrate within the routing channels, the current sink regions electrically coupled to the semiconductor substrate and to at least one of the conductive pathways conducting a voltage supply signal such that the voltage level of the semiconductor substrate is maintained near the voltage level of the voltage supply.

7. The integrated circuit device of claim 6 wherein the active devices within the active regions comprise at least one CMOS inverter comprising a p-channel field effect transistor and an n-channel field effect transistor, the p-channel transistor and n-channel transistor each comprising a drain coupled to one another, the n-channel field effect transistor comprising a source coupled to the voltage supply level.

8. The device of claim 6 wherein the voltage level of the substrate is kept within approximately 0.7 volts of the second supply voltage.

* * * * *